United States Patent [19]

Smith

[11] 4,037,147

[45] July 19, 1977

[54] ISOLATION AMPLIFIER FOR RESISTIVE AND INDUCTIVE LOADS

[75] Inventor: Robert Neal Smith, Camarillo, Calif.

[73] Assignee: The United States of America as represented by the Secretary of the Navy, Washington, D.C.

[21] Appl. No.: 661,479

[22] Filed: Feb. 26, 1976

[51] Int. Cl.² .............................................. H02P 7/68
[52] U.S. Cl. .................................................. 318/632
[58] Field of Search ................ 318/632, 633; 307/229; 340/347 CC

[56] References Cited

U.S. PATENT DOCUMENTS 3,575,647  4/1971  Levy .................................. 318/632

Primary Examiner—Herman T. Hohauser
Attorney, Agent, or Firm—Richard S. Sciascia; Joseph M. St. Amand; William W. Cochran, II

[57] ABSTRACT

Isolation amplifier circuitry for driving inductive as well as resistive loads in an interchangeable circuit design. The device comprises a differential amplifier having both A.C. and D.C. feedback paths when used in both modes of operation with a capability of programmable gain.

4 Claims, 3 Drawing Figures

ISOLATION AMPLIFIER FOR RESISTIVE AND INDUCTIVE LOADS

BACKGROUND OF THE INVENTION

The present invention pertains generally to amplifiers and more particularly to isolation amplifiers used in analog computers. In the past, two different types of amplifiers have been used in an analog computer system depending upon the type of load used in conjunction with the amplifier. High gain differential amplifiers have typically been used for resistive loads while open loop variable gain amplifiers have been used in conjunction with resolver, i.e., inductive loads. These two amplifiers, however, could not be used interchangeably with the two different types of loads of the analog computer. This has required a parts inventory of amplifiers and associated circuitry of twice that which would be required if a single amplifier could be used for both resistive and inductive loads. In addition, it is desirable to have programmable gain functions provided by the amplifier rather than open loop gain adjustment as required in the amplifiers previously used in conjunction with inductive loads. To provide a single amplifier such as a differential amplifier which can be used both with resistive and inductive loads, both D.C. and A.C. feedback must be provided in the circuit design. Until now, circuitry has not been provided for the interchangeable use of a differential amplifier with both types of loads having both A.C. and D.C. feedback paths.

SUMMARY OF THE INVENTION

The present invention overcomes the disadvantages and limitations of the prior art by providing an isolation amplifier for both resistive and inductive loads. The present invention utilizes a high gain differential amplifier eliminating the need for open loop gain adjustment and providing programmable gain for both resistive and inductive loads. The circuitry design allows the amplifier to be interchangeably used with both types of loads and provides both A.C. and D.C. feedback paths for both.

It is therefore an object of the present invention to provide isolation amplifier circuitry for both resistive and inductive loads.

It is also an object of the present invention to provide isolation amplifier circuitry for both resistive and inductive loads having both A.C. and D.C. feedback paths.

Another object of the present invention is to provide isolation amplifier circuitry wherein a single amplifier can be interchangeably used with both resistive and inductive loads.

Other objects and further scope of applicability of the present invention will become apparent from the detailed description given hereinafter. The detailed description, indicating the preferred embodiment of the invention, is given only by way of illustration since various changes and modifications within the spirit and scope of the invention will become apparent to those skilled in the art from the detailed description. The foregoing abstract of the disclosure is for the purpose of providing a non-legal brief statement to serve as a searching, scanning tool for scientists, engineers and researchers and is not intended to limit the scope of the invention as disclosed herein nor is it intended to be used in interpreting or in any way limiting the scope or fair meaning of the appended claims.

DETAILED DESCRIPTION OF THE PREFERRED EMBODIMENT

Figure 1:
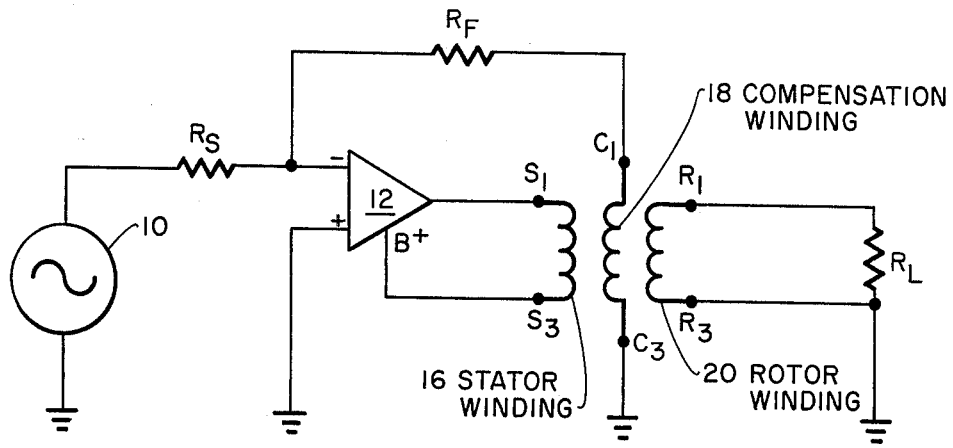
FIG. 1 is a schematic diagram of the prior art amplifier circuitry used in conjunction with inductive loads.

The resolver loads conventionally used in analog computers for coordinate conversions have compensation windings that isolate the open loop gain type amplifier 12 as shown in FIG. 1. The resolver compensation winding 18 is adjacent to stator winding 16 and has an essentially one-to-one turns ratio. The rotor winding 20 is coupled to the compensation winding and has the load $R_L$ connected in series with it. As shown in FIG. 1, the prior art inductive load circuitry provides an A.C. feedback path through $R_S$. No D.C. feedback path is provided by the circuitry since D.C. feedback is not required by the open loop gain amplifier 12.

The high gain differential amplifiers 14 used to provide a programmable gain require both A.C. and D.C. feedback for proper operation. The prior art circuitry of FIG. 1 therefore requires modification to use a differential, i.e., isolation amplifier which can be used interchangeably with circuitry design for resistive loads.

Figure 2:
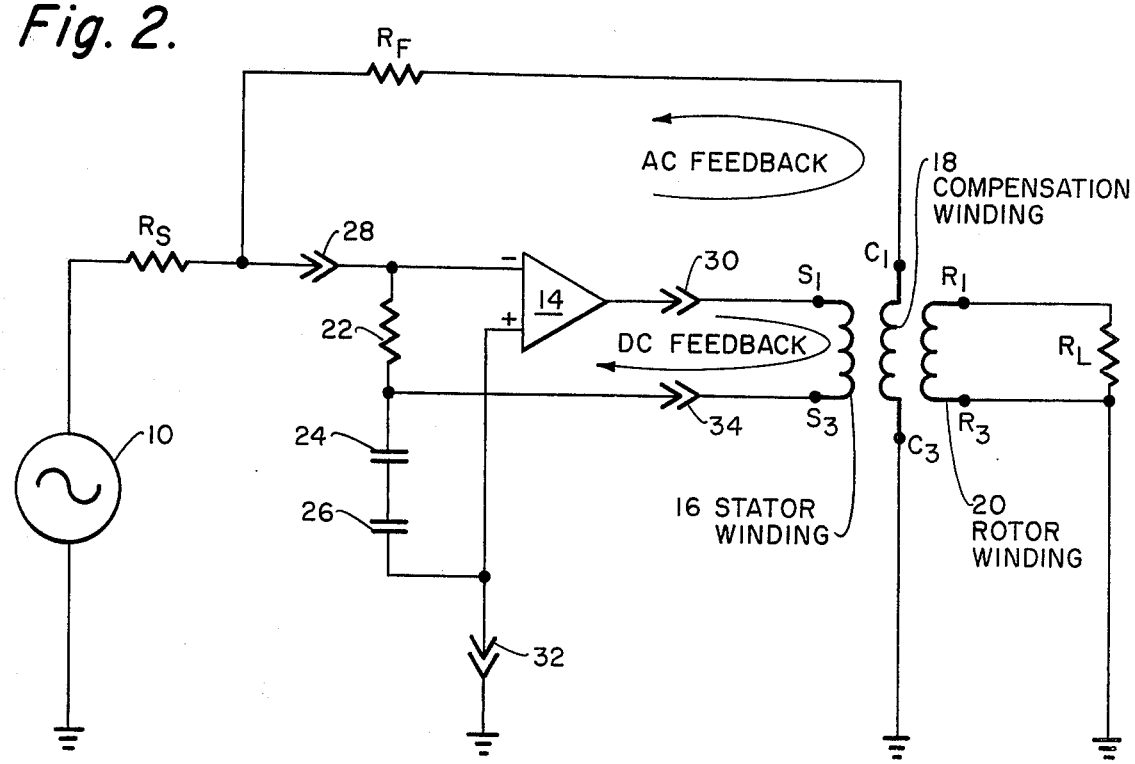
FIG. 2 is a schematic diagram of the circuitry of the preferred embodiment of the invention as used in conjunction with inductive loads.

FIG. 2 is a schematic illustration of isolation amplifier circuitry used in conjunction with inductive loads. A high gain differential amplifier 14 is used in the circuitry of FIG. 2 with resistor 22 and capacitors 24 and 26 as a separate module which can be inserted in the circuit via connectors 28, 30, 32 and 34. An A.C. feedback path to the input of the differential amplifier 14 is provided from a compensation winding 18 through $R_F$. The purpose of the compensation winding 18 is to provide the necessary compensation in the couplings between the stator winding 16 and rotor winding 20 such that the voltages applied between $S_1$ and $S_3$ of the stator winding are accurately reflected between $R_1$ and $R_3$ of the rotor winding 20. The compensation winding 18 therefore more accurately reflects the voltages provided to the load $R_L$ than the driving voltages reflected over the stator winding 16. For this reason, it is preferable to provide an A.C. feedback path from the compensation winding through $R_F$ rather than a feedback path through the stator winding 16.

The D.C. feedback required by the high gain differential amplifier 14, to keep it from going into saturation, is applied to the input of the differential amplifier through a resistor 22 from the output of the differential amplifier and through the stator winding 16. This keeps the amplifier output at a zero D.C. potential. To avoid feeding back the A.C. signal from the stator winding 16 to the input to the differential amplifier 14 (through the D.C. feedback path), a pair of capacitors 24 and 26 are connected between $S_3$ and ground. The impedance of capacitors 24 and 26 taken together are very low in comparison to the impedance of the stator winding 16 and the resistance of resistor 22. Capacitors 24 and 26 therefore act as an A.C. short to the ground so that the A.C. signal applied to the stator winding 16, which is not fully representative of the A.C. signal being applied to the load $R_L$, is not fed back through the D.C. feedback path.

Figure 3:
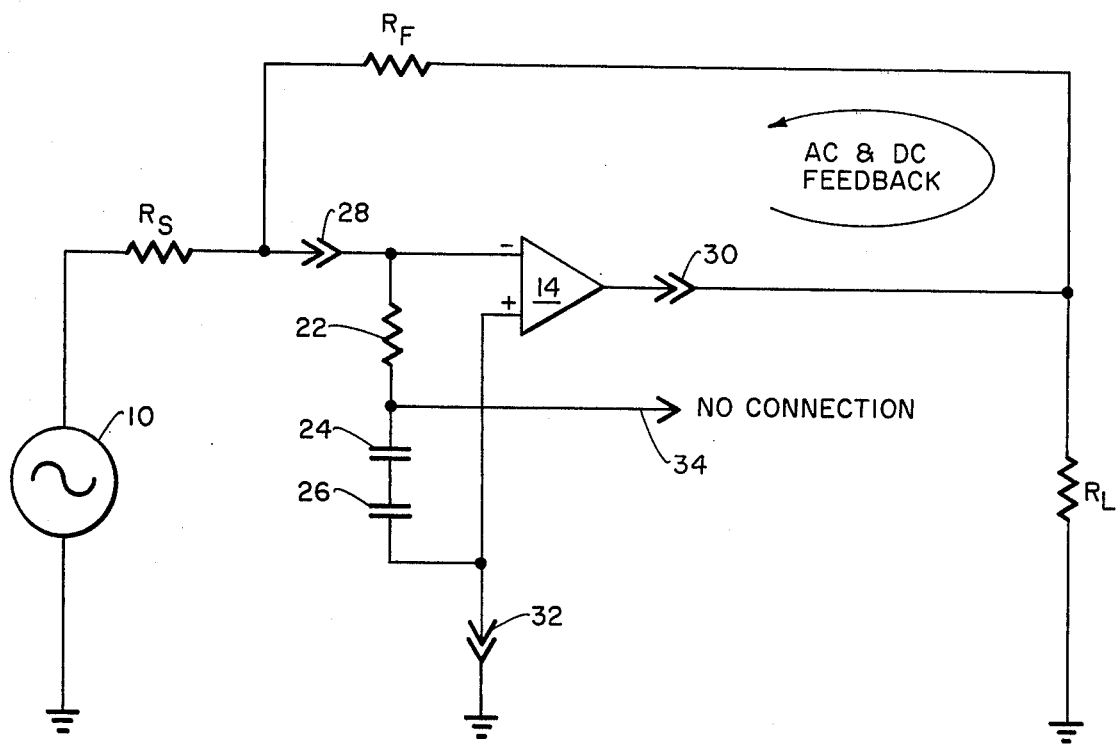
FIG. 3 is the circuitry of the preferred embodiment of the invention as used in conjunction with resistive loads.

FIG. 3 illustrates the circuitry used in conjunction with resistive loads. The differential amplifier 14, resistor 22, and capacitors 24 and 26 can be interchangeably used in the circuitry of either FIG. 2 or FIG. 3 for inductive loads or resistive loads, respectively. Connectors 28 through 34 provide a means for interchangeably connecting this circuitry to either circuit for any desired reason. As shown in FIG. 3, the A.C. and D.C. feedback paths are both completed through the feedback resistor $R_F$. Connector 34 is not used so that resistor 22 and capacitors 24 and 26 are essentially out of the circuit of FIG. 3. Resistance 22 is sufficiently high, e.g., 22 megs., so that any A.C. coupling between the inputs of the differential amplifier is essentially non-existent.

Since the differential amplifier 14 has a very high gain, the overall gain of the circuitry of both FIGS. 2 and 3 can be programmed by varying the ratio of the resistances of $R_F$ and $R_S$. This eliminates the need for an open loop amplifier gain adjustment, such as that required by the old amplifier 12 of the prior art circuitry of FIG. 1. Better accuracy can be obtained for the desired overall gain by the programmable gain method used in the present invention. In addition, the differential amplifier 14 and associated circuitry, resistor 22 and capacitors 24 and 26, can be used interchangeably with either inductive loads or resistive loads, thereby reducing the equipment inventory by one-half, amounting to substantial savings and greater simplicity and reliability for the overall system.

Obviously many modifications and variations of the present invention are possible in light of the above teachings. It is therefore to be understood that within the scope of the appended claims the invention may be practiced otherwise than as specifically described herein.

What is claimed is:

1. Isolation amplifier circuitry for use with inductive loads comprising:

a. differential amplification means for producing an amplified signal;
   b. a stator winding connected to said differential amplification means for producing a flux field which varies with said amplified signal;
   c. D.C. feedback resistive means connected to said stator winding for feeding back D.C. potentials from said stator winding to the input of said differential amplification means to prevent said differential amplification means from going into saturation;
   d. compensation winding means for detecting said flux field produced by said stator winding and producing an A.C. signal which varies with said detected flux field;
   e. A.C. feedback resistive means connected to said compensation winding means for feeding back said A.C. signal produced in said compensation winding to said input of said differential amplification means to adjust overall gain of said circuitry; wherein said A.C. signal produced by said compensation winding is representative of an A.C. signal produced by a rotor winding and delivered to a load connected to said rotor winding such that said gain of said overall circuitry is properly adjusted for said load.

2. The isolation amplifier circuitry of claim 1 further comprising low impedance capacitive means connected to said D.C. feedback resistive means and ground potential for shunting A.C. signals applied to said stator winding to ground potential.

3. The isolation amplifier circuitry of claim 1 further comprising a plurality of connectors for disconnecting said differential amplification means and said D.C. feedback resistive means for interchangeable use in an isolation amplifier for resistive loads.

4. The isolation amplifier circuitry of claim 2 further comprising a plurality of connectors for disconnecting said differential amplification means, said D.C. feedback resistive means and said low impedance capacitive means as a single electrical component for interchangeable use in an isolation amplifier.

* * * * *